US011281392B2

(12) United States Patent
Huang et al.

(10) Patent No.: US 11,281,392 B2
(45) Date of Patent: Mar. 22, 2022

(54) GARBAGE COLLECTION IN A MEMORY COMPONENT USING AN ADJUSTED PARAMETER

(71) Applicant: Micron Technology, Inc., Boise, ID (US)

(72) Inventors: Jianmin Huang, San Carlos, CA (US); Aparna U. Limaye, Boise, ID (US); Avani F. Trivedi, Eagle, ID (US); Tomoko Ogura Iwasaki, San Jose, CA (US); Tracy D. Evans, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/995,345

(22) Filed: Aug. 17, 2020

(65) Prior Publication Data

US 2021/0064265 A1 Mar. 4, 2021

Related U.S. Application Data

(60) Provisional application No. 62/892,694, filed on Aug. 28, 2019.

(51) Int. Cl.
*G06F 3/06* (2006.01)
*G06F 12/10* (2016.01)
(Continued)

(52) U.S. Cl.
CPC .......... *G06F 3/0647* (2013.01); *G06F 3/0608* (2013.01); *G06F 3/0673* (2013.01);
(Continued)

(58) Field of Classification Search
CPC .... G06F 3/0647; G06F 3/0608; G06F 3/0673; G06F 12/10; G06F 2212/1044;
(Continued)

(56) References Cited

U.S. PATENT DOCUMENTS 5,127,014 A 6/1992 Raynham
7,688,614 B2 3/2010 Morimoto
(Continued)

FOREIGN PATENT DOCUMENTS

JP 2010244342 A 10/2010
KR 20090053901 A 5/2009
(Continued)

OTHER PUBLICATIONS

International Search Report and Written Opinion for International Application No. PCT/US2020/047074 dated Nov. 20, 2020, 9 pages.
(Continued)

*Primary Examiner* — Fernando Hidalgo
(74) *Attorney, Agent, or Firm* — Lowenstein Sandler LLP (57) ABSTRACT

Systems, apparatuses, and methods related to media management, including "garbage collection," in memory or storage systems or sub-systems, such as solid state drives, are described. For example, a criticality value can be determined and used as a basis for managing a garbage collection operation on a data block. A controller or the system or sub-system may determine that a criticality value associated with performing a garbage collection operation satisfies a condition. Based on determining that the condition is satisfied, a parameter associated with performing the garbage collection operation can be adjusted. The garbage collection operation is performed on the data block stored on the memory component using the adjusted parameter.

20 Claims, 5 Drawing Sheets

(51) Int. Cl.
*G11C 16/34* (2006.01)
*G11C 16/24* (2006.01)
*G11C 16/04* (2006.01)

(52) U.S. Cl.
CPC .............. *G06F 12/10* (2013.01); *G11C 16/24* (2013.01); *G11C 16/3459* (2013.01); *G06F 2212/1044* (2013.01); *G06F 2212/657* (2013.01); *G11C 16/0483* (2013.01)

(58) Field of Classification Search
CPC ........... G06F 2212/657; G06F 12/0246; G06F 2212/7205; G06F 3/0652; G11C 16/3459; G11C 16/24; G11C 16/0483; G11C 16/32; G11C 16/349; G11C 16/105; G11C 29/52; G11C 16/3495; Y10S 707/99957
USPC ......................................................... 711/154
See application file for complete search history.

(56) References Cited

U.S. PATENT DOCUMENTS

| | | | |
|---|---|---|---|
| 9,514,057 B2 | 12/2016 | Marcu et al. | |
| 10,761,728 B2* | 9/2020 | Hong | G06F 12/0804 |
| 10,853,243 B2* | 12/2020 | Davis | G06F 3/0616 |
| 2005/0144357 A1 | 6/2005 | Sinclair | |
| 2006/0136687 A1 | 6/2006 | Conley et al. | |
| 2007/0174579 A1* | 7/2007 | Shin | G06F 12/0246 |
| | | | 711/170 |
| 2007/0237003 A1 | 10/2007 | Melik-Martirosian et al. | |
| 2009/0073771 A1 | 3/2009 | Li | |
| 2009/0319720 A1 | 12/2009 | Stefanus et al. | |
| 2013/0046920 A1 | 2/2013 | Ryu et al. | |
| 2013/0055047 A1 | 2/2013 | Sharon et al. | |
| 2013/0339572 A1 | 12/2013 | Fanning et al. | |
| 2014/0032817 A1 | 1/2014 | Bux et al. | |
| 2014/0204672 A1 | 7/2014 | Lee et al. | |
| 2015/0154118 A1 | 6/2015 | Marcu et al. | |
| 2015/0205539 A1 | 7/2015 | Moon et al. | |
| 2016/0011971 A1 | 1/2016 | Lee et al. | |
| 2016/0026526 A1 | 1/2016 | Zhang et al. | |
| 2016/0092128 A1 | 3/2016 | Jain et al. | |
| 2016/0179386 A1 | 6/2016 | Zhang | |
| 2017/0046256 A1 | 2/2017 | Horspool et al. | |
| 2018/0024779 A1 | 1/2018 | Kojima | |
| 2018/0059934 A1 | 3/2018 | Lee et al. | |
| 2018/0189175 A1 | 7/2018 | Ji et al. | |
| 2018/0314579 A1 | 11/2018 | Sampayo et al. | |
| 2019/0095323 A1* | 3/2019 | Gidra | G06F 12/0269 |
| 2019/0163622 A1 | 5/2019 | Wu et al. | |
| 2020/0110537 A1* | 4/2020 | Hahn | G06F 11/108 |
| 2020/0110706 A1 | 4/2020 | Takeuchi et al. | |
| 2020/0133572 A1 | 4/2020 | Park | |
| 2020/0174700 A1 | 6/2020 | Seong | |

FOREIGN PATENT DOCUMENTS

| | | |
|---|---|---|
| KR | 20100122720 A | 11/2010 |
| KR | 20140116617 A | 10/2014 |

OTHER PUBLICATIONS

International Search Report and Written Opinion for International Application No. PCT/US2020/047263 dated Nov. 20, 2020, 11 pages.
International Search Report and Written Opinion for International Application No. PCT/US2020/047075, dated Nov. 20, 2020, 10 pages.
International Search Report and Written Opinion for International Application No. PCT/US2020/047260, dated Nov. 25, 2020, 10 pages.
International Search Report and Written Opinion for International Application No. PCT/US2020/048393, dated Nov. 25, 2020, 10 pages.

\* cited by examiner

GARBAGE COLLECTION IN A MEMORY COMPONENT USING AN ADJUSTED PARAMETER

RELATED APPLICATION

This application claims the benefit of U.S. Provisional Application No. 62/892,694, filed Aug. 28, 2019, the entire contents of which are hereby incorporated by reference herein.

TECHNICAL FIELD

Embodiments of the disclosure relate generally to memory sub-systems, and more specifically, relate to garbage collection in a memory component using an adjusted parameter.

BACKGROUND

A memory sub-system can be a storage device, a memory module, and a hybrid of a storage device and memory module. The memory sub-system can include one or more memory components that store data. The memory components can be, for example, non-volatile memory components and volatile memory components. In general, a host system can utilize a memory sub-system to store data at the memory components and to retrieve data from the memory components.

BRIEF DESCRIPTION OF THE DRAWINGS

The disclosure will be understood more fully from the detailed description given below and from the accompanying drawings of various embodiments of the disclosure. The drawings, however, should not be taken to limit the disclosure to the specific embodiments, but are for explanation and understanding only.

DETAILED DESCRIPTION

Aspects of the present disclosure are directed to garbage collection in a memory component using an adjusted parameter. A memory sub-system can be a storage device, a memory module, or a hybrid of a storage device and memory module. Examples of storage devices and memory modules are described below in conjunction with FIG. 1. In general, a host system can utilize a memory sub-system that includes one or more memory components (also hereinafter referred to as "memory devices"). The host system can provide data to be stored at the memory sub-system and can request data to be retrieved from the memory sub-system.

When the host system requests to store data, the data is stored at a physical address within the memory component. The host system provides a logical address identifying the data to be stored. A logical to physical (L2P) mapping table is maintained to identify the physical location where the data corresponding to each logical address resides. A memory component in a memory sub-system can include one or more memory pages (also referred to herein as "pages") for storing one or more bits of binary data corresponding to data received from the host system. One or more memory pages of the memory component can be grouped together to form a data block. When the data is written to the memory component, it is typically done at the page level, such that an entire page, or multiple pages, is written in a single operation. When the host system requests to update data at a particular logical address, the updated data is stored at a new physical location (e.g., a new physical address) and the L2P mapping is updated so that the particular logical address of the data is mapped to the new physical address. The original data (e.g., the data prior to the update) still remains stored in the original physical address. This data, however, is no longer valid from the host's perspective, and is no longer usable by the host. With various changes in data, the memory component accumulates physical addresses across various data blocks that have invalid data, in addition to having physical addresses with valid data. The invalid data stored at the memory component is considered "garbage" and can be cleaned out at some point.

When the memory component is full, such that there is insufficient capacity to accept data from additional write operations, certain data can be erased in order to free up space. When data is erased from the memory component, however, it is typically done at the block level, such that an entire block (including multiple pages) is erased in a single operation. Thus, when a particular segment of data on the memory component is updated, certain pages in a block will have data that has been re-written to a different location and/or is no longer needed. The entire block cannot simply be erased as each block likely also has some number of pages of valid data. A garbage collection ("GC") process can be performed which involves migrating (e.g., rewriting) those pages of the block that contain valid data to another block, so that the current block with both valid and invalid data can be erased. Garbage collection is a form of automatic memory management that attempts to reclaim garbage, or memory occupied by stale data objects that are no longer in use (e.g., because they have been updated with new values). The basic principle of garbage collection is to find data objects that cannot or need not be accessed in the future, and to reclaim the resources (i.e. storage space) used by those objects.

A conventional memory sub-system can include a controller that determines when it is appropriate to initiate a garbage collection operation. The controller can perform calculations to determine an optimum time for performing the GC operation, optimizing for various factors. In some examples, GC is initiated periodically as part of regular memory management operations for the memory sub-system. In other examples, GC is initiated in response to a particular event, such as, receiving a write request (e.g., from the host system) and a determination that memory components have insufficient capacity to accept the write request. In some examples, the controller can determine that the memory component is full and/or there is insufficient capacity to accept any other additional write operations that can be received from the host and that garbage collection needs to be performed to free up space in the memory component. In some examples, the controller can determine that the memory sub-system, or certain components within the memory sub-system, is in an idle state or is experiencing downtime and GC can be performed during this time. Based on the determination of the appropriate time, the controller can initiate the garbage collection operation to erase invalid data from certain blocks.

The controller can determine to perform GC under various circumstances. In some examples, performing the GC can be critical due to the particular circumstance. In other examples, performing GC can be non-urgent. In some examples, performing GC can take a significant amount of time. For example, the data blocks can be very fragmented due both valid and invalid data in various locations of each data block, making the GC operation to take a significant amount of time. In some examples, performing the GC operation can be necessary within a short amount of time. For example, the memory component can be full and capacity to accept additional host write requests can be insufficient, calling for the GC operation to be performed immediately. Based on the length of time to perform GC and how soon GC needs to be performed, the criticality level of performing GC may vary. However, in conventional systems, whether performing GC is critical or not, GC operation is optimized to achieve high performance. GC can be a power intensive operation. GC can require complex algorithms to optimize for various factors, which may consume significant battery power. When GC is not critical to perform, using valuable battery power can be wasteful.

Aspects of the present disclosure address the above and other deficiencies by having a memory sub-system that can perform garbage collection using different parameters depending on the criticality of performing the GC operation. In one implementation, a controller in the memory sub-system can determine an appropriate time to perform a GC operation by determining that a criterion (e.g., system idle status) is satisfied to perform the GC operation on a memory component of the memory sub-system. When the criterion is satisfied, the controller can determine the criticality level associated with performing the GC operation. For example, the controller can calculate a criticality value associated with performing the GC. In some examples, the criticality value can be compared to a criticality condition defined for the memory component. For example, the criticality condition can be satisfied if the criticality value is below a defined threshold value. If the controller determines that the criticality value satisfies the criticality condition, then the controller can adjust the optimization factors used with the GC by default. The controller can change a parameter associated with the GC operation so that reduced battery power is used for the GC operation.

The present disclosure reduces the effects of performing garbage collection on battery consumption based on the criticality of performing the garbage collection operation by changing parameters of the GC operation. Advantages of the present disclosure include, but are not limited to, preserving battery life for performing important and urgent operations, increased performance of the memory sub-system as battery power is preserved, not wasting valuable computing resources on optimizing performing garbage collection operations that do not need optimization, overall performance of the memory sub-system can be improved as other read or write operations can be performed by the memory sub-system using the battery power that is saved instead of expending the battery power on performing the garbage collection operation, etc.

Figure 1:
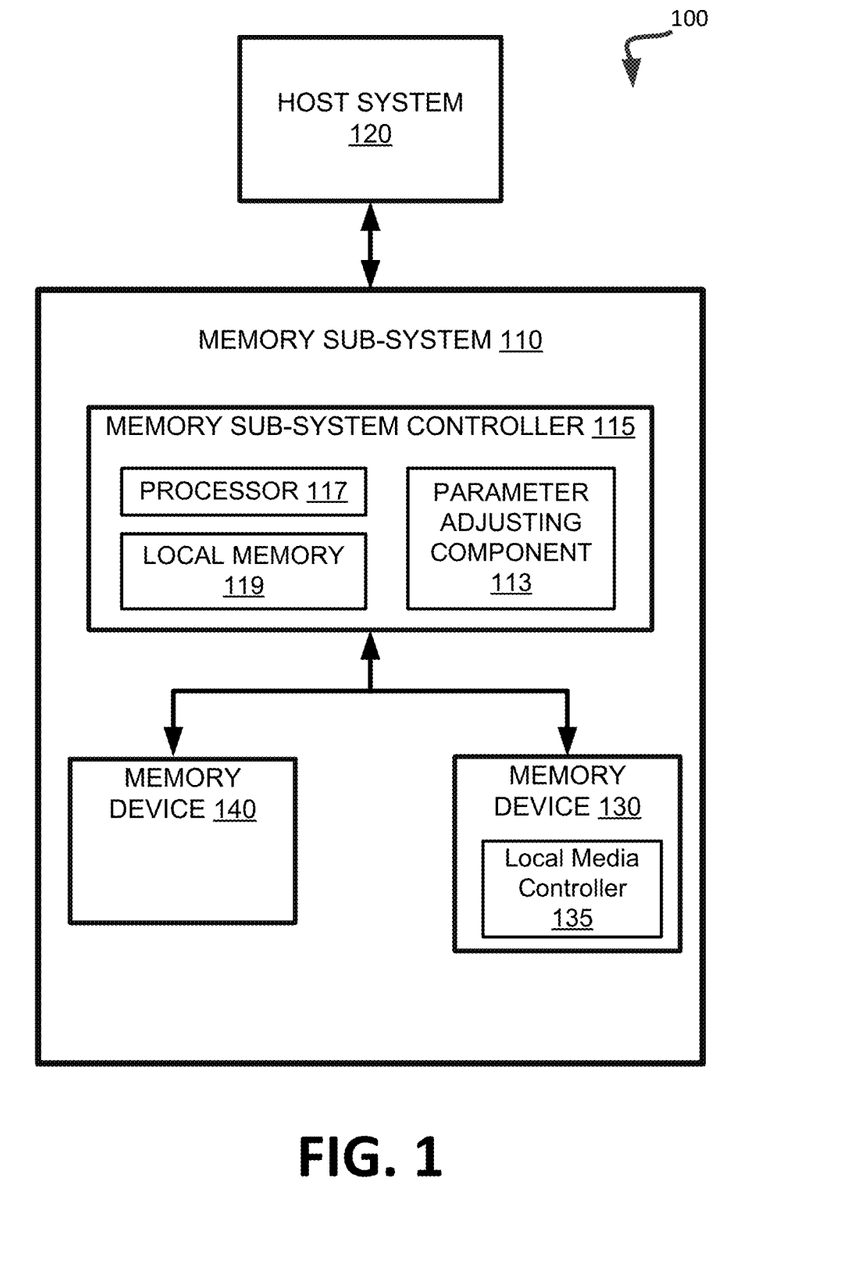
FIG. 1 illustrates an example computing environment that includes a memory sub-system in accordance with some embodiments of the present disclosure.

FIG. 1 illustrates an example computing environment 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, and a hard disk drive (HDD). Examples of memory modules include a dual in-line memory module (DIMM), a small outline DIMM (SO-DIMM), and a non-volatile dual in-line memory module (NVDIMM).

The computing environment 100 can include a host system 120 that is coupled to one or more memory sub-systems 110. In some embodiments, the host system 120 is coupled to different types of memory sub-system 110. FIG. 1 illustrates one example of a host system 120 coupled to one memory sub-system 110. The host system 120 uses the memory sub-system 110, for example, to write data to the memory sub-system 110 and read data from the memory sub-system 110. As used herein, "coupled to" generally refers to a connection between components, which can be an indirect communicative connection or direct communicative connection (e.g., without intervening components), whether wired or wireless, including connections such as electrical, optical, magnetic, etc.

The host system 120 can be a computing device such as a desktop computer, laptop computer, network server, mobile device, or such computing device that includes a memory and a processing device. The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), etc. The physical host interface can be used to transmit data between the host system 120 and the memory sub-system 110. The host system 120 can further utilize an NVM Express (NVMe) interface to access the memory components (e.g., memory devices 130) when the memory sub-system 110 is coupled with the host system 120 by the PCIe interface. The physical host interface can provide an interface for passing control, address, data, and other signals between the memory sub-system 110 and the host system 120.

The memory devices can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

An example of non-volatile memory devices (e.g., memory device 130) includes a negative-and (NAND) type flash memory. Each of the memory devices 130 can include one or more arrays of memory cells such as single level cells (SLCs) or multi-level cells (MLCs) (e.g., triple level cells (TLCs) or quad-level cells (QLCs)). In some embodiments, a particular memory component can include an SLC portion, and an MLC portion, a TLC portion, or a QLC portion of memory cells. Each of the memory cells can store one or more bits of data used by the host system 120. Furthermore, the memory cells of the memory devices 130 can be grouped as memory pages or memory blocks that can refer to a unit of the memory component used to store data.

Although non-volatile memory components such as NAND type flash memory are described, the memory device 130 can be based on any other type of non-volatile memory, such as read-only memory (ROM), phase change memory (PCM), magneto random access memory (MRAM), negative-or (NOR) flash memory, electrically erasable programmable read-only memory (EEPROM), and a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased.

The memory sub-system controller 115 can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processor (processing device) 117 configured to execute instructions stored in local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 may not include a memory sub-system controller 115, and may instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical block address and a physical block address that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130.

The memory sub-system 110 includes a parameter adjusting component 113 that can adjust a parameter associated with a garbage collection operation based on criticality of performing the garbage collection operation. In some embodiments, the memory sub-system controller 115 includes at least a portion of the parameter adjusting component 113. For example, the memory sub-system controller 115 can include a processor 117 (processing device) configured to execute instructions stored in local memory 119 for performing the operations described herein. In some embodiments, the parameter adjusting component 113 is part of the host system 110, an application, or an operating system.

The parameter adjusting component 113 can determine the criticality level associated with performing a garbage collection operation on data blocks of the memory components. For example, parameter adjusting component 113 can calculate a criticality value associated with performing the GC. When parameter adjusting component 113 determines that a criticality value associated with performing the GC satisfies the criticality condition (e.g., that the criticality value is below a defined threshold value), parameter adjusting component 113 can adjust the parameters used by default to optimize the GC operation. Parameter adjusting component 113 can change a parameter associated with the GC operation so that battery power usage is reduced for the GC operation. Further details with regards to the operations of the parameter adjusting component 113 are described below.

Figure 2:
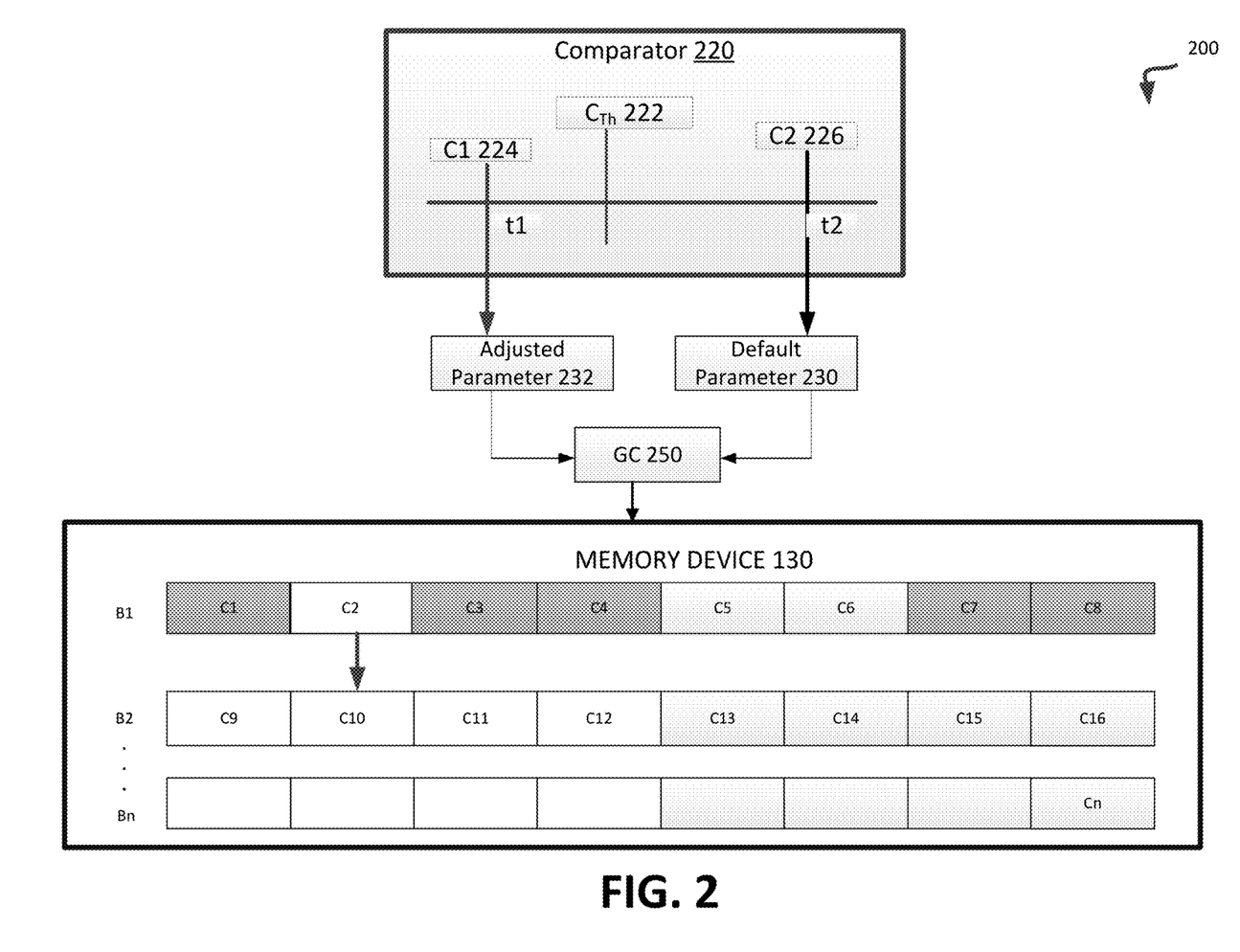
FIG. 2 illustrates an example of garbage collection in a memory component using an adjusted parameter, in accordance with some embodiments of the present disclosure.

FIG. 2 illustrates an example of garbage collection in a memory component of a memory sub-system 200 using an adjusted parameter, in accordance with some embodiments of the present disclosure. In general, the memory sub-system 200 can correspond to the memory sub-system 110 of FIG. 1. For example, the memory sub-system 200 can include parameter adjusting component 113 of FIG. 1. In some embodiments, parameter adjusting component 113 can be configured to monitor a criticality value associated with performing a garbage collection operation within the memory sub-system 200 and to determine whether to perform the garbage collection operation using a default parameter or an adjusted parameter.

Controller 115 can perform calculations to determine an optimum time for performing the GC operation based on policies set in controller 115, optimizing for various factors (e.g., sequential write, dirty condition, etc.). Based on the calculations, controller 115 can determine whether a criterion to perform a GC operation is satisfied. An example criterion can be that the memory sub-system 200 is to be in an idle state (e.g., there is no active host read/write request being performed). In some examples, controller 115 can determine that the memory sub-system 200, or certain components within the memory sub-system, is in an idle state or is experiencing downtime. When the criterion is satisfied (e.g., idle state), GC can be performed during this time. Some of the other criteria can include a periodic scheduled time for GC occurred, a particular event occurred that requires a GC operation to be performed, the memory component being full, memory component having insufficient capacity to accept additional write requests, etc.

Controller 115 can calculate a criticality value associated with performing a garbage collection operation. The criticality value can indicate the level of criticality (e.g., necessity, urgency, etc.) to perform the GC operation. In one example, the level of criticality can be determined using factors, such as, amount of invalid data on the data block, availability of additional data blocks to accept a write request from a host machine, etc.

As shown in the example of FIG. 2, memory component 112 can include a number of memory cells (e.g., C1 to Cn). Each of the memory cells can store one or more bits of binary data corresponding to data received from the host system 120. Separate data blocks (e.g., B1, B2, Bn, etc.) in the memory component 112 can be formed by grouping the memory cells together. In an example, controller 115 can determine that memory component 112 is in a clean condition (e.g., does not contain too much invalid data) or dirty condition (e.g., contain too much invalid data).

In some implementations, the criticality of performing GC can be tracked using a mapping table. For example, a mapping table can identify whether each cell of the data block contains valid data, invalid data, or any data at all. In an implementation, the mapping table can be based on the L2P table that maps logical locations to physical locations. In an example, the mapping table can be the L2P table itself. In another example, the mapping table can be another layer of mapping derived from the L2P table. For example, a mapping table can be derived, based on the L2P map, to track regions of the memory component that include valid data and regions that include invalid data, where the regions can be at the same level of granularity tracked in the L2P table, or aggregated for a higher level. In one example, the mapping table can indicate that all data blocks include valid data, in which scenario, the need to perform a GC can be low or non-existent. In this situation, performing the GC operation can be considered to be not critical and a factor to set the criticality value to zero or closer to zero can be satisfied. In another example, the mapping table can indicate that many of the cells in various data blocks contain invalid data, and/or the memory component includes highly fragmented data (e.g., partially valid, partially invalid, etc.). In the example shown in FIG. 2, memory cells C1, C3, C4, C7, and C8 of data block B1 contain invalid data and memory cells C2, C5, and C6 of data block B1 contain valid data. Controller 115 can determine that data block B1 is too dirty. In this situation, a significant amount of time can be expected to be spent on performing the GC operation and/or more complexity can be expected with the GC operation. In this scenario, a garbage collection operation can move the valid data to a different block and erase the data block to erase the invalid data from the data blocks. In this situation, performing the GC operation can be considered to be critical and a factor to set the criticality value to a high value (e.g., closer to 100 out of a scale of 100) can be satisfied.

In some examples, the mapping table can indicate that there is sufficient capacity to accept additional host writes in the future, so a GC operation is not necessary to be performed. In this situation, performing the GC operation can be considered to be not critical and a factor to set the criticality value to zero or closer to zero can be satisfied. In another example, the mapping table can indicate insufficient capacity to accept additional host write operations. The mapping table can be used to predict that a GC operation needs to be performed to clear the data blocks in a short amount of time so that additional host write operations can be accepted. In this situation, performing the GC operation can be considered to be critical and a factor to set the criticality value to a high value (e.g., closer to 100 out of a scale of 100) can be satisfied. In some example, performing the GC operation can be considered to be not critical when available number of free blocks to write data is above a threshold value. The amount of data to perform the GC operation on can be determined based on factors such as logic and physical saturation percentage values. In a scenario like this, the GC can be scheduled on a periodic basis. In other examples, GC can be necessary on an immediate basis due to being considered critical. For example, the system resources (e.g., amount of free blocks, etc.) can become critically low (e.g., below a threshold value) such that an immediate GC operation is performed in order to make sure the memory component can perform satisfactorily.

In some implementations, an overall criticality value (e.g., C1 224, C2 226, etc.) can be calculated based on the factors associated with criticality values. In some examples, the overall criticality value can be calculated using the mapping table. In some examples, the criticality value can be calculated in view of additional or alternate factors, such as, how much work is necessary to perform the GC operation (e.g., length of time needed, number of steps to be performed, etc.) and/or how soon the GC is needed to be performed. Other examples of data that is tracked and/or used to assess criticality value can include block usage and status maintained in other data structures beyond the L2P table, types of blocks, page count validity information, relative time of creation of data, wear leveling and read disturb information, various system counters, number of available free blocks, erase count of blocks, percentage of valid data in the memory component, logic saturation, physical saturation, amount of available idle time, etc. For example, In an implementation, the memory sub-system 200 can specify one or more threshold criticality value $C_{Th}$ 222. Controller 115 can compare the criticality value associated with performing a GC operation to the threshold criticality value $C_{Th}$ 222. The comparison can be performed using a comparator 220. Comparator 220 can compare a criticality value to the threshold criticality value $C_{Th}$ 222 to determine whether the criticality value associated with performing the garbage collection operation satisfies a first criticality condition. In an example, the first criticality condition can be defined as the criticality value being below the threshold criticality value. FIG. 2 shows a criticality value C1 224 (e.g., a value of 10) at one point in time t1. Comparator 220 can compare the threshold criticality value $C_{Th}$ 222 and the criticality value C1 224. The comparator 220 can determine that the criticality value C1 224 is below the threshold criticality value $C_{Th}$ 222. In another example, the first criticality condition can be defined as the criticality value being identified as low criticality.

If it is determined that the criticality value C1 224 satisfies the first criticality condition, parameter adjusting component 113 can adjust a parameter associated with performing the GC operation. In the example of FIG. 2, when it is determined that the criticality value C1 224 is below the threshold criticality value $C_{Th}$ 222, satisfying the first criticality condition, an adjusted parameter 232 is used to perform the GC operation 250 on the data blocks B1 through Bn of memory device 130. More specifically, a default value of a parameter associated with performing the GC operation 250 is updated to a modified value of the parameter.

In some implementations, the parameter can be adjusted by increasing the time duration allotted to performing the GC operation. For example, the adjusted parameter can result in the GC operation to be slower than when performed with a default parameter. In some examples, a timing waveform associated with performing the GC can be modified. The longer the time it takes to perform the GC operation (e.g., the slower the GC operation), the less power intensive is the GC operation. In some examples, the parameter can be adjusted by decreasing a power level associated with performing the GC operation. In some examples, the parameter can be adjusted by reducing a bitline precharge current associated with the garbage collection operation. For example, if an additional time is allotted for the GC operation in addition to the default time to perform the GC, a percentage of the bitline precharge current can be reduced from the amount of current that is necessary for the default GC operation. In some examples, the parameter can be adjusted by performing a target-only-verify operation during program verification. In some examples, the parameter can be adjusted by adjusting a fast/slow system command prefix ("the prefix") associated with GC. For example, when a GC operation is considered to be not critical, the prefix can be set to indicate a slow mode, and the slow mode can be called to perform the GC operation to save power. On the other hand, when GC is determined to be critical, a fast mode can be set for the prefix such that GC operation can be performed with default power level, or even at increased power level, as necessary.

In some implementations, the controller 115 can perform the GC operation 250 using the adjusted parameter until the criticality value changes to satisfy a second criticality condition. In some examples, the second criticality condition can be defined as the criticality value being equal to or above the threshold criticality value. FIG. 2 shows a criticality value C2 226 (e.g., a value of 80) at one point in time t2. If it is determined that the criticality value C2 226 does not satisfy the first criticality condition, or alternatively, satisfies the second criticality condition, parameter adjusting component 113 does not adjust the parameter associated with performing the GC operation. In the example of FIG. 2, when it is determined that the criticality value C2 226 is equal to or above the threshold criticality value $C_{Th}$ 222, satisfying the second criticality condition (or, alternatively not satisfying the first criticality condition), default parameter 230 is used to perform the GC operation 250 on the data blocks B1 through Bn of memory device 130. More specifically, the default value of a parameter associated with performing the GC operation 250 is used for performing the operation.

Figure 3:
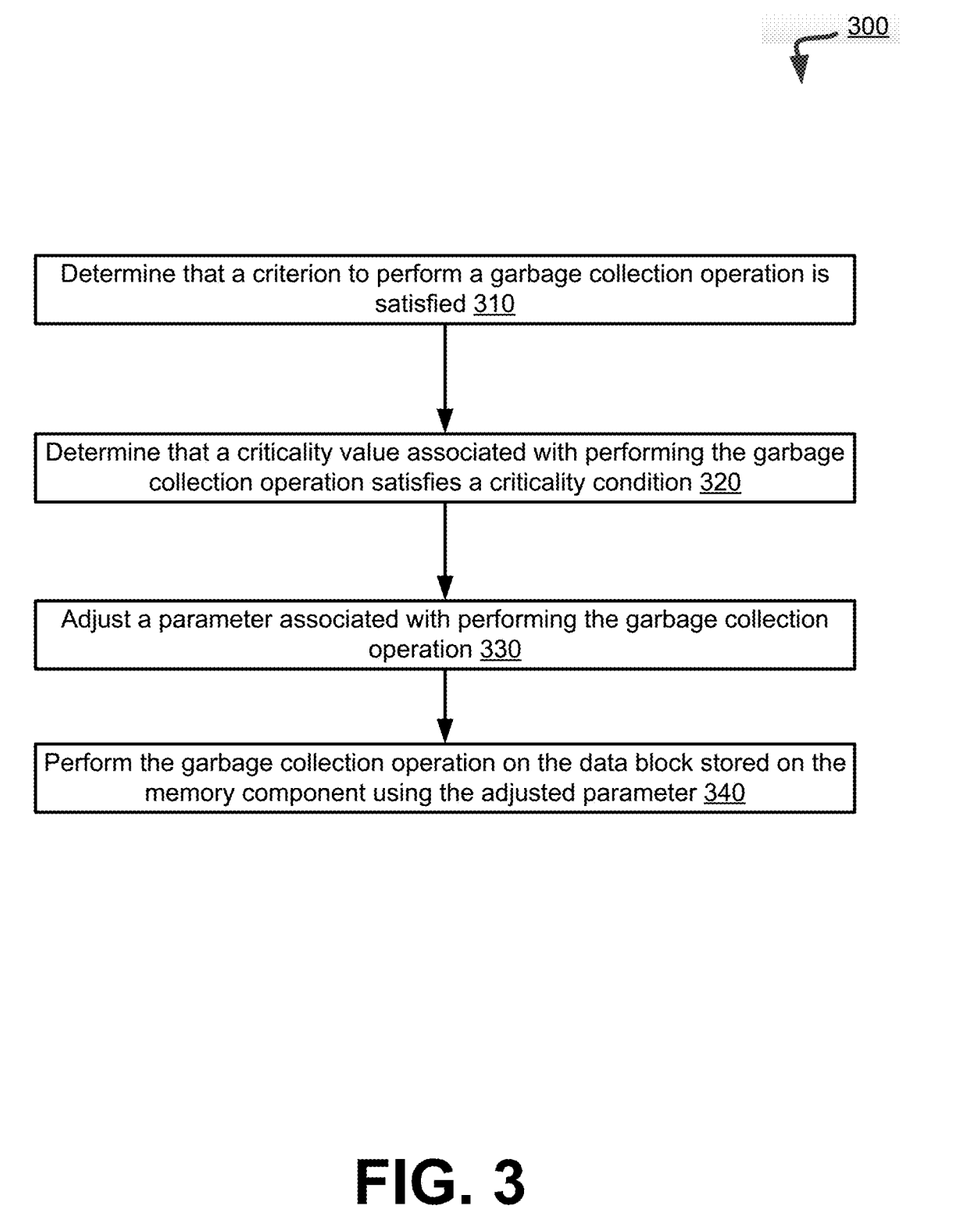
FIG. 3 is a flow diagram of an example method to perform a garbage collection operation using an adjusted parameter, in accordance with some embodiments of the present disclosure.

FIG. 3 is a flow diagram of an example method 300 to perform a garbage collection operation using an adjusted parameter, in accordance with some embodiments of the present disclosure. The method 300 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 300 is performed by the parameter adjusting component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 310, the processing device determines that a criterion to perform a garbage collection operation is satisfied, the garbage collection operation to be performed on a data block stored on the memory component. In an example, the criterion may be specified as the system being in idle mode. For example, the memory sub-system can be in an idle mode when the memory sub-system is not performing a host read or write request.

At operation 320, the processing device determines that a criticality value associated with performing the garbage collection operation satisfies a criticality condition. In some examples, the criticality value is calculated in view of an amount of invalid data in the data block and availability of additional data blocks to accept a write request from a host machine. In an example, criticality value satisfies a criticality condition when the criticality value is below a threshold criticality value.

At operation 330, the processing device adjusts a parameter associated with performing the garbage collection operation. In an example, the parameter is adjusted by adjusting a default parameter value to a modified parameter value. In some implementations, the parameter can be adjusted by increasing the time duration allotted to performing the GC operation. For example, the adjusted parameter can result in the GC operation to be slower than when performed with a default parameter. In some examples, a timing waveform associated with performing the GC can be modified. In some examples, the parameter can be adjusted by decreasing a power level associated with performing the GC operation. In some examples, the parameter can be adjusted by reducing a bitline precharge current associated with the garbage collection operation. In some examples, the parameter can be adjusted by performing a target-only-verify operation during program verification.

At operation 340, the processing device performs the garbage collection operation on the data block stored on the memory component using the adjusted parameter. In some examples, the adjusted parameter can result in the GC operation to be slower than when performed with a default parameter. In some examples, the adjusted parameter can result in the GC operation to consume less power than when the GC is performed with a default parameter.

Figure 4:
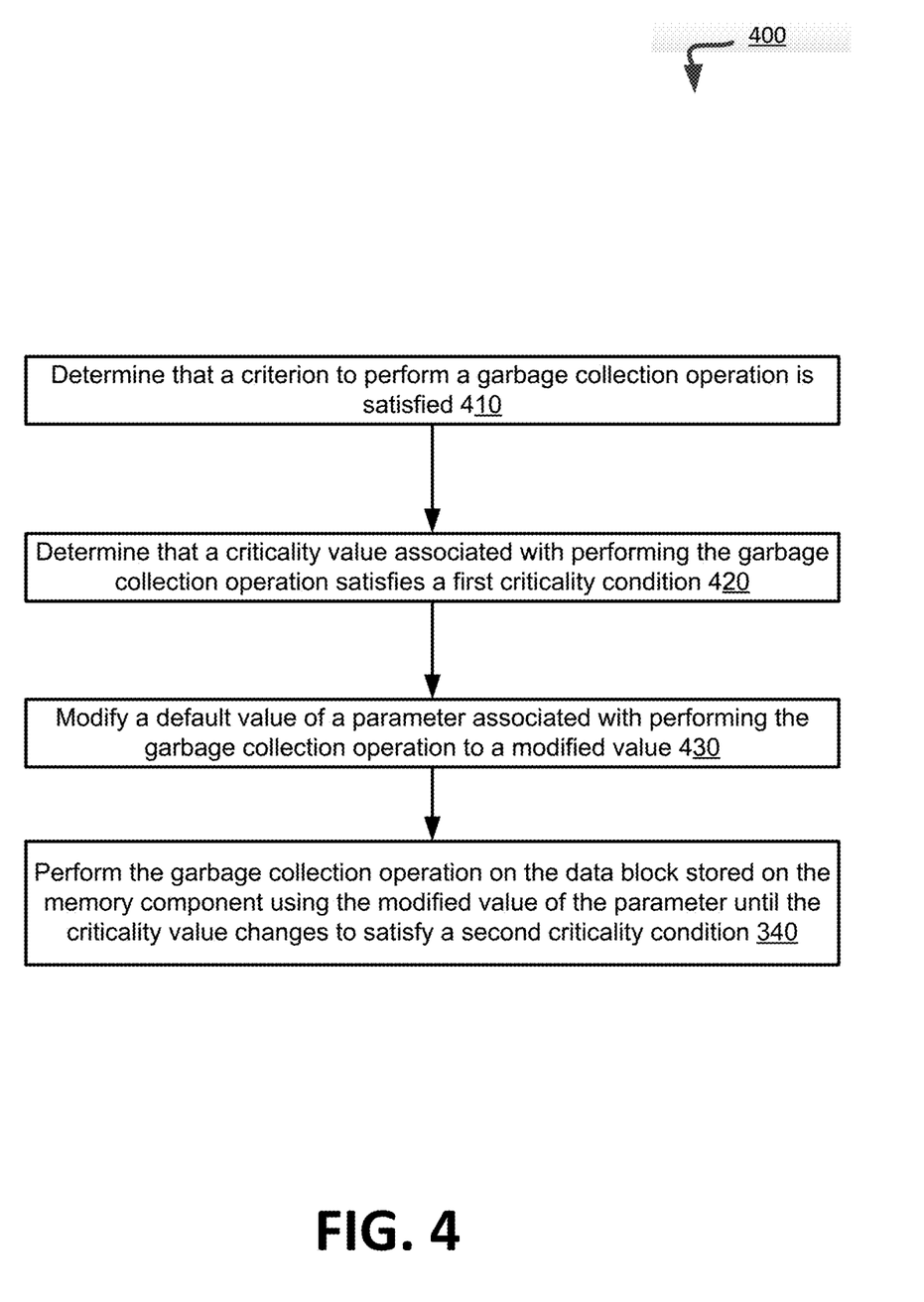
FIG. 4 is a flow diagram of an example method to perform a garbage collection operation using a modified value of a parameter, in accordance with some embodiments of the present disclosure.

FIG. 4 is a flow diagram of an example method 400 to perform a garbage collection operation using a modified value of a parameter, in accordance with some embodiments of the present disclosure. The method 400 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 400 is performed by the parameter adjusting component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 410, the processing device determines that a criterion to perform a garbage collection operation is satisfied, the garbage collection operation to be performed on a data block stored on the memory component. In an example, the criterion may be specified as the system experiencing a down time. For example, the memory sub-system can experience a down time when the memory sub-system is performing an insignificant number of host read or write request, or no host read or write request at all.

At operation 420, the processing device determines that a criticality value associated with performing the garbage collection operation satisfies a first criticality condition. In some examples, the criticality value is calculated in view of an amount of invalid data in the data block and/or availability of additional data blocks to accept a write request from a host machine. In an example, criticality value satisfies a criticality condition when the criticality value is below a threshold criticality value.

At operation 430, the processing modifies a default value of a parameter associated with performing the garbage collection operation to a modified value. In some implementations, the default value of the parameter can be changed to a modified value by increasing the time duration allotted to performing the GC operation. For example, the adjusted parameter can result in the GC operation to be slower than when performed with a default parameter. In some examples, a timing waveform associated with performing the GC can be modified. In some examples, the default value of the parameter can be changed to a modified value by decreasing a power level associated with performing the GC operation. In some examples, the default value of the parameter can be changed to a modified value by reducing a bitline precharge current associated with the garbage collection operation. In some examples the default value of the parameter can be changed to a modified value by performing a target-only-verify operation during program verification.

At operation 440, the processing device performs the garbage collection operation on the data block stored on the memory component using the modified value of the parameter until the criticality value changes to satisfy a second criticality condition. In some examples, the criticality value satisfies the second criticality condition when the criticality value is equal to or above the threshold criticality value. In some examples, the adjusted parameter can result in the GC operation to be slower than when performed with a default parameter. In some examples, the adjusted parameter can result in the GC operation to consume less power than when the GC is performed with a default parameter.

Figure 5:
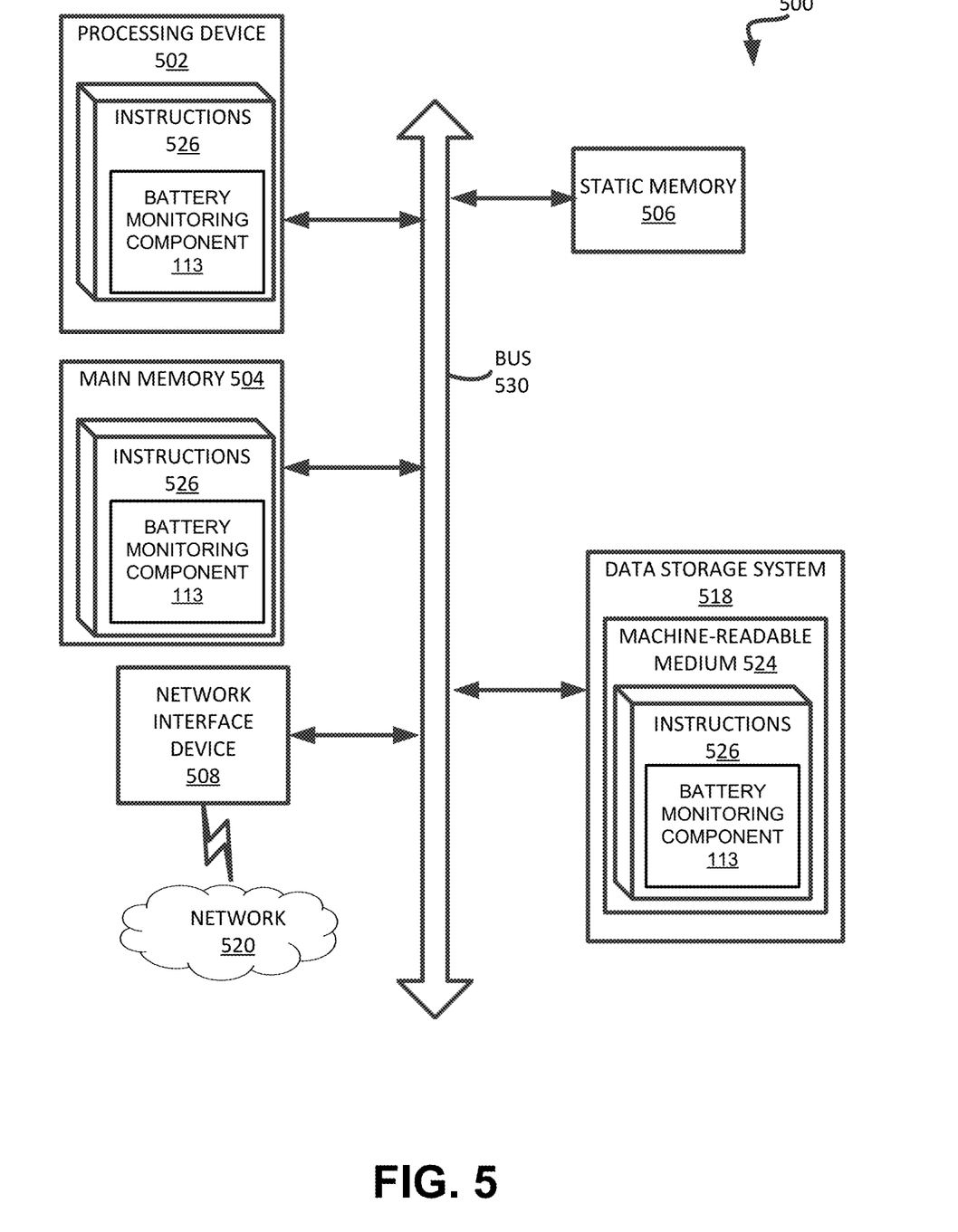
FIG. 5 is a block diagram of an example computer system in which embodiments of the present disclosure may operate.

FIG. 5 illustrates an example machine of a computer system 500 within which a set of instructions, for causing the machine to perform any one or more of the methodologies discussed herein, can be executed. In some embodiments, the computer system 500 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the parameter adjusting component 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 500 includes a processing device 502, a main memory 504 (e.g., read-only memory (ROM), flash memory, dynamic random access memory (DRAM) such as synchronous DRAM (SDRAM) or RDRAM, etc.), a static memory 506 (e.g., flash memory, static random access memory (SRAM), etc.), and a data storage system 518, which communicate with each other via a bus 530.

Processing device 502 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 502 can also be one or more special-purpose processing devices such as an application specific integrated circuit (ASIC), a field programmable gate array (FPGA), a digital signal processor (DSP), network processor, or the like. The processing device 502 is configured to execute instructions 526 for performing the operations and steps discussed herein. The computer system 500 can further include a network interface device 508 to communicate over the network 520.

The data storage system 518 can include a machine-readable storage medium 524 (also known as a computer-readable medium) on which is stored one or more sets of instructions 526 or software embodying any one or more of the methodologies or functions described herein. The instructions 526 can also reside, completely or at least partially, within the main memory 504 and/or within the processing device 502 during execution thereof by the computer system 500, the main memory 504 and the processing device 502 also constituting machine-readable storage media. The machine-readable storage medium 524, data storage system 518, and/or main memory 504 can correspond to the memory sub-system 110 of FIG. 1.

In one embodiment, the instructions 526 include instructions to implement functionality corresponding to a parameter adjusting component (e.g., the parameter adjusting component 113 of FIG. 1). While the machine-readable storage medium 524 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A system comprising:
a memory component; and
a processing device, operatively coupled with the memory component, to:
determine that a criterion to perform a garbage collection operation for a data block stored on the memory component is satisfied, the garbage collection operation comprising migration of one or more pages of the data block that contain valid data to another block for management of the data block;
determine that a value associated with criticality of performing the garbage collection operation satisfies a condition;
responsive to determining that the value associated with criticality satisfies the condition, adjust a parameter associated with performing the garbage collection operation; and
perform the garbage collection operation on the data block stored on the memory component using the adjusted parameter.

2. The system of claim 1, wherein to determine that the value associated with criticality satisfies the condition, the processing device is to:
determine that the value associated with criticality is below a threshold value.

3. The system of claim 1, wherein the value associated with criticality is calculated in view of an amount of invalid data in the data block and availability of additional data blocks to accept a write request from a host machine.

4. The system of claim 1, wherein to adjust the parameter, the processing device is to:
adjust the parameter from a default parameter value to a modified parameter value.

5. The system of claim 1, wherein to adjust the parameter, the processing device is to increase a time duration allotted to perform the garbage collection operation.

6. The system of claim 1, wherein to adjust the parameter, the processing device is to adjust a timing waveform associated with performing the garbage collection operation.

7. The system of claim 1, wherein to adjust the parameter, the processing device is to reduce a bitline precharge current associated with the garbage collection operation.

8. The system of claim 1, wherein to adjust the parameter, the processing device is to perform a target-only-verify operation during program verification.

9. A method comprising:
determining that a criterion to perform a garbage collection operation for a data block stored on a memory component of a memory subsystem is satisfied, the garbage collection operation comprising migration of one or more pages of the data block that contain valid data to another block for management of the data block;
determining that a value associated with criticality of performing the garbage collection operation satisfies a first condition;
upon determining that the value associated with criticality satisfies the first condition, modifying a default value of a parameter associated with performing the garbage collection operation to a modified value; and performing the garbage collection operation on the data block stored on the memory component using the modified value of the parameter until the value associated with criticality changes to satisfy a second condition.

10. The method of claim 9, wherein determining that the value associated with criticality satisfies the first condition comprises:
determine that the value associated with criticality is below a threshold value, wherein the value satisfies the second condition when the value is equal to or above the threshold value.

11. The method of claim 9, wherein the value associated with criticality is calculated in view of an amount of invalid data in the data block and availability of additional data blocks to accept a write request from a host machine.

12. The method of claim 9, wherein modifying the default value of the parameter to a modified value comprises:
increasing a default time duration allotted to perform the garbage collection operation to a modified time duration.

13. The method of claim 9, wherein modifying the default value of the parameter to a modified value comprises reducing a bitline precharge current associated with the garbage collection operation.

14. The method of claim 9, wherein modifying the default value of the parameter to a modified value comprises performing a target-only-verify operation during program verification.

15. A non-transitory computer-readable storage medium comprising instructions that, when executed by a processing device, cause the processing device to:
determine that a criterion to perform a garbage collection operation for a data block stored on a memory component of a memory subsystem is satisfied, the garbage collection operation comprising migration of one or more pages of the data block that contain valid data to another block for management of the data block;
determine that a value associated with criticality of performing the garbage collection operation satisfies a condition;
responsive to determining that the value associated with criticality satisfies the condition, adjust a parameter associated with performing the garbage collection operation; and
perform the garbage collection operation on the data block stored on the memory component using the adjusted parameter.

16. The non-transitory computer-readable storage medium of claim 15, wherein to determine that the value associated with criticality satisfies the criticality condition, the processing device is to:
determine that the value associated with criticality is below a threshold value.

17. The non-transitory computer-readable storage medium of claim 15, wherein the value associated with criticality is calculated in view of an amount of invalid data in the data block and availability of additional data blocks to accept a write request from a host machine.

18. The non-transitory computer-readable storage medium of claim 15, wherein to adjust the parameter, the processing device is to:
adjust the parameter from a default parameter value to a modified parameter value.

19. The non-transitory computer-readable storage medium of claim 15, wherein to adjust the parameter, the processing device is to increase a time duration allotted to perform the garbage collection operation.

20. The non-transitory computer-readable storage medium of claim 15, wherein to adjust the parameter, the processing device is to reduce a bitline precharge current associated with the garbage collection operation.

* * * * *